US 12,132,416 B2

(12) United States Patent
Kim et al.

(10) Patent No.: US 12,132,416 B2
(45) Date of Patent: Oct. 29, 2024

(54) FREQUENCY GENERATOR FOR GENERATING A WORKING FREQUENCY FOR A RAIL CONTACT OF AN AXLE COUNTER

(71) Applicant: GTS Deutschland GmbH, Ditzingen (DE)

(72) Inventors: Minho Kim, Gerlingen (DE); Rainer Klemm, Steinheim (DE)

(73) Assignee: GTS Deutschland GmbH, Ditzingen (DE)

( * ) Notice: Subject to any disclaimer, the term of this patent is extended or adjusted under 35 U.S.C. 154(b) by 134 days.

(21) Appl. No.: 18/068,855

(22) Filed: Dec. 20, 2022

(65) Prior Publication Data
US 2023/0198423 A1 Jun. 22, 2023

(30) Foreign Application Priority Data
Dec. 20, 2021 (EP) .................................. 21215978

(51) Int. Cl.
*H02M 7/5383* (2007.01)
*B61L 1/16* (2006.01)
(Continued)

(52) U.S. Cl.
CPC ........... *H02M 7/5383* (2013.01); *B61L 1/165* (2013.01); *H02M 7/4815* (2021.05);
(Continued)

(58) Field of Classification Search
CPC .. H02M 7/4815; H02M 7/538; H02M 7/5383; H02M 7/53832; H02M 7/53846; B61L 1/165; B61L 1/167
See application file for complete search history.

(56) References Cited

U.S. PATENT DOCUMENTS

| 5,563,777 | A | * | 10/1996 | Miki | ................. | H02M 7/53832 |
| | | | | | | 363/124 |
| 5,841,650 | A | | 11/1998 | Stevens | | |
| 2019/0273447 | A1 | * | 9/2019 | Takemoto | ......... | H02M 7/53803 |

FOREIGN PATENT DOCUMENTS

| CA | 2115104 C | 4/1997 |
| CN | 102611134 A | 7/2012 |

(Continued)

OTHER PUBLICATIONS

Cortes-Rodriguez, et al., "Self-Oscillating DC-DC Resonant Converter", IEEE Computer Society, 2012, 300-304, 10.1109 CERMA. 2012.56.
(Continued)

*Primary Examiner* — Gary A Nash
(74) *Attorney, Agent, or Firm* — Orbit IP, LLP (57) ABSTRACT

A frequency generator for generating a working frequency for a transmission signal of a rail contact of an axle counter includes a series resonant circuit having a transmitter coil unit of the rail contact and a capacitor. The frequency generator has an inverter, the output of which is connected to the capacitor. The inverter is configured to generate an oscillating voltage and to feed the generated oscillating voltage to the transmitter coil unit of the rail contact via the capacitor. A current transformer synchronizes the output voltage of the inverter to the current in the series resonant circuit. A start-up circuit electrically connected to the inverter is configured to trigger the inverter and to be electrically connected to an input power supply. The frequency generator is a robust and effective circuit for generation of magnetic fields where manufacturing effort and expensive components can be reduced.

13 Claims, 5 Drawing Sheets

(51) Int. Cl.
  *H02M 7/48* (2007.01)
  *H02M 7/53846* (2007.01)
  *H02M 7/5387* (2007.01)
(52) U.S. Cl.
  CPC ...... *H02M 7/5387* (2013.01); *H02M 7/53832* (2013.01); *H02M 7/53846* (2013.01)

(56) References Cited

FOREIGN PATENT DOCUMENTS

| | | |
|---|---|---|
| DE | 3402349 C2 | 5/1987 |
| EP | 2 496 459 B1 | 2/2014 |
| JP | 2008-145155 A | 6/2008 |
| KR | 10-2018-0100961 A | 9/2018 |
| WO | WO-2019181376 A1 * | 9/2019 .............. H02J 50/05 |

OTHER PUBLICATIONS

International IOR Rectifier, "Self-Oscillating Half-Bridge Driver" IR21541, Preliminary Data Sheet No. PD60132I, 1-7.
Seidel et al., "A Design Methodology for a Self-Oscillating Electronic Ballast", IEEE Transactions on Industry Applications, vol. 43, No. 6, Nov./Dec. 2007, 1524-1533.
Siemens Semiconductor Group, "IGBT Power Module", BSM 50 GB 170 DN2, Jul. 31, 1996, 1-9.
Thales Transportation Systems GMBH, "Axle Counter Az LM", 2016, 8 Pages.
Wang et al., "2.65MHz Self-Oscillating Complementary Electronic Ballast with Constant-Lamp-Current Control for Metal Halide Lamp", IEEE Transactions on Power Electronics, Dec. 2007, 87 Pages.

* cited by examiner

— Gate to source voltage of M440

— · · Current of D260

Fig. 4

— Current of L330

— · · Voltage across L330

FREQUENCY GENERATOR FOR GENERATING A WORKING FREQUENCY FOR A RAIL CONTACT OF AN AXLE COUNTER

CROSS-REFERENCE TO RELATED APPLICATIONS

This application claims priority to European Patent Application No. EP 21215978.4, filed Dec. 20, 2021, the entire contents of which are hereby incorporated in full by this reference.

DESCRIPTION

Field of the Invention

The invention concerns a frequency generator for generating a working frequency for a transmission signal of a rail contact of an axle counter comprising a series resonant circuit the frequency generator comprising a transmitter coil unit of the rail contact and a capacitor. The invention further comprises an axle counter comprising an according frequency generator and a method for generating a working frequency for a rail contact of an axle counter.

Background of the Invention

A frequency generator for generating a working frequency for a rail contact of an axle counter is known from [Thales].

A rail contact is an axle counter head comprising a transmitter coil unit (comprising at least one transmission coil) and a receiver coil unit (comprising at least one receiving coil). While the rail contact is attached to the rail, the other electronic components of the frequency generator are located in an electronic unit near the rail remote from the rail contact.

Axle counters detect passing trains and are used to determine whether a track section is free or occupied by a train. An axle counter comprises detection points with rail contacts, i.e. sensors (transmitter coil unit and receiving coil unit), which are attached to the rail and an electronic unit located near the respective rail contact. When an axle passes a rail contact a voltage pulse ("wheel pulse") is induced at the detection point causing an initial voltage to change (detected signal). The electronic unit is connected to an axle counter evaluator, which evaluates the detected signals and generates a track occupancy information. The track occupancy information is then transferred to a control system.

It is crucial to tune the frequency generated by an electronic circuitry to the frequency of the axle counter head, in order to ensure that the generated voltage has a constant intensity. For the axle counter known from [Thales], this is done manually inside circuitry with significant effort during production. In addition, to ensure reliable detection of a passing wheel, high-precision inductors are required, which are expensive.

SUMMARY OF THE INVENTION

Object of the Invention

It is an object of the invention to provide a frequency generator for a rail contact of an axle counter that requires less manufacturing effort and less expensive components and to provide a method using this frequency generator.

This object is achieved by a frequency generator according to claim 1, an axle counter according to claim 10, and a method according to claim 11.

According to the invention, the frequency generator further comprises: an inverter, the output of which is connected to the capacitor, wherein the inverter is configured to generate an oscillating voltage and to feed the generated oscillating voltage to the transmitter coil unit of the rail contact via the capacitor; a current transformer for synchronizing the output voltage of the inverter to the current in the series resonant circuit; and a start-up circuit electrically connected to the inverter, configured to trigger the inverter and configured to be electrically connected to an input power supply.

The series resonant circuit (transmitter coil unit+capacitor connected downstream of the inverter) defines the frequency of the transmission signal.

While the prior art circuits were using an oscillator and a power amplifier to drive enough power into the transmitter coil, these two functions and their components are combined according to the invention.

The inventive frequency generator forms a self-oscillating inverter, wherein the current transformer feeds back the current in the resonant circuit to the inverter as a voltage. This means that the output voltage of the inverter is kept synchronized to the current of the series resonant circuit, so that the resonance oscillation does not break down. In consequence, the inverter always follows the frequency given by the capacitor and the transmitter coil unit (output of inverter is in phase with current of series resonant circuit).

Self-oscillating inverters are known to be used in Power Modules as known from [Siemens] and [Wang], where a self-oscillating complementary electronic ballast with a constant-lamp-current control for a metal halide lamp is disclosed in order to generated constant voltage or constant current at an output.

In the present invention however, the voltage or the current are not in the focus. According to the invention, the load (the transmitter coil unit in the transmitter head of the rail contact) is part of the resonance circuit of the SOI. In consequence, the electromagnetic field at this transmitter coil unit is maximum with the lowest possible power consumption overall.

A tuning process during manufacturing for tuning the frequency generated by the electronic circuitry to the frequency of the axle counter head is not required any more with the inventive frequency generator.

While with the prior art circuits a test is always required to determine whether the series resonant circuit can actually oscillate in the complete frequency range that is available due to the tolerances this test can be omitted with the inventive frequency generator, since it works over a very large frequency range. Therefore, the number of expensive and complex components can be reduced. Only standard components are required. In particular, integrated circuits (IC) can be omitted, which reduces costs and enhances robustness and reliability.

The inventive frequency generator also simplifies the variation of working frequencies for different variants of the series resonant circuit. Thus future upgrades can be easily done.

The frequency generator preferably comprises an integrated input power supply. Alternatively, an external power supply can be connected to the frequency generator. The input power supply is a DC-power supply.

The start-up-circuit of the inventive frequency generator initially effects the operation of the inverter (sets the inverter into an oscillating state). With the rising edge of the supply voltage, the start-up circuit generates a trigger to switch the inverter the first time. This causes the resonant circuit to start oscillating. From then on, the further triggers for maintaining the oscillation are generated automatically by detecting the current in the series resonant circuit with the help of the current transformer.

The inverter of the inventive frequency generator preferably always switches at zero crossing of the current in the resonance circuit, i.e., stress-free, which additionally increases the lifetime of the device.

In order to synchronizing the output voltage of the inverter, the current transformer is preferably configured to feed the current of the series resonant circuit to a control input of the inverter.

The current transformer preferably comprises two identical primary coils and a secondary coil. The secondary coil is electrically connected to the output of the inverter and induces current to the primary coils. The induced current is fed to the control input of the inverter.

The secondary coil of current transformer is preferably series-connected to the transmitter coil unit.

The inverter is preferably configured to disable the start-up circuit. As soon as the inverter is set into an oscillating state, the inverter disables the start-up circuit.

In a highly preferred embodiment, the inverter is a half bridge inverter. The inverter comprises a low-side gate driver and a high-side gate driver. Each gate driver comprises a switch, which is triggered by the start-up circuit to conduct in order to start oscillation of the inverter. By switching the switch into conducting state, the start-up circuit is disabled. Alternatively, a full bridge inverter could be used.

Preferably, blocking capacitors are provided which also work as input voltage divider.

The high-side gate driver preferably comprises a high path filter to remove any unwanted low frequency oscillation, while the low-side gate driver comprises a low path filter to remove any unwanted high frequency oscillation.

In a highly preferred embodiment of the inventive frequency generator the low gate driver comprises a short-circuit protection capacitor.

In case of a short-circuited transmission coil unit (e.g., due to a damaged field cable) the short-circuit protection capacitor interrupts the circuit and thus forms as short circuit protection. The frequency generator according to this embodiment forms a short-circuit protected self-oscillating inverter.

By using the short-circuit protection capacitor no current limiter is required to protect the input power supply from overcurrent.

Nevertheless, in a more basic embodiment, a current limiter may be provided.

In order to insulate the resonant circuit from the electronic it is preferred that a power transformer is electrically connected between inverter and capacitor. This is helpful for personal safety because the cabling to the rail contact could be influenced with high induced voltages. In this embodiment, the output voltage of the inverter is applied to a primary of the power transformer, i.e. to the output of the inverter. The power transformer is adapted for galvanic isolation of the electronic components on the primary side (which in particular comprises the inverter and the primary coils of the current transformer) from the electronic components on the secondary side (which in particular comprises the transmitter coil unit and the secondary coil of the current transformer).

In an alternative embodiment, the power transformer can be omitted if the self-oscillating inverter is completely assigned to the "hot" side, i.e., is at risk to be influenced with high induced voltages (e.g., the cable to the rail contact and the cable to the Axle Counter Evaluator). To allow a maintainer to work at the electronic without additional safety measures all these interfaces to the "hot side" shall be insulated.

The transmitter coil unit and the capacitor of the series resonant circuit is preferably connected via a field cable. A field cable is a cable located in the field, i.e., in particular between the electronic unit and the rail contact (sensor) of a detection point. The field cable is exposed to environmental influences and therefore runs an increased risk of being damaged.

The invention also concerns an axle counter comprising a frequency generator as described before. The inventive axle counter further comprises a receiver coil unit and an axle counter evaluation unit electrically connected to the receiver coil unit. The receiver coil unit is tuned/dimensioned using bandpass filters to the required frequency range, so that it works for all frequencies, which can be set by component tolerances and tolerances by temperature influences.

The invention also concerns a method for generating a working frequency for a rail contact of an axle counter using a frequency generator as described before. According to the invention, the output voltage of the inverter is synchronized to the current in the series resonant circuit by feeding back the current in the series resonant circuit to a control input of the inverter using a current transformer.

In a preferred variant, a DC voltage is applied to a start-up circuit, and the start-up circuit triggers the inverter.

It is highly preferred that a power transformer is used for galvanic isolation of the series resonant circuit from other electronic components of the frequency generator.

The inventive frequency generator forms a robust and effective circuit for generation of magnetic fields.

Further advantages of the invention can be derived from the description and the drawings. In addition, the above-mentioned and the still further described features can be used according to the invention individually or in any combination. The embodiments shown and described are not to be understood as a conclusive list, but rather have an exemplary character for the description of the invention.

DETAILED DESCRIPTION OF THE PREFERRED EMBODIMENTS

Figure 1A:
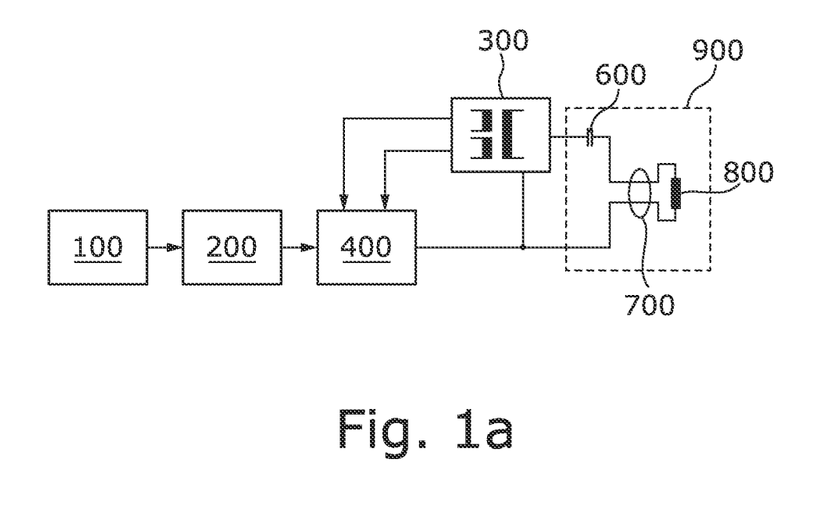
FIG. 1a shows a schematic layout of a basic embodiment of the frequency generator according to the invention.

FIG. 1a shows a basic embodiment of the inventive frequency generator with a series resonant circuit 900 comprising a transmitter coil unit 800 of a rail contact and a capacitor 600.

A DC input power supply 100 feeds a start-up circuit 200, which is electrically connected to an inverter 400. The start-up circuit 200 triggers the inverter 400, which as a result begins to oscillate and generates an oscillating voltage with a working frequency $f_0$. The output of the inverter 400 is connected to a capacitor 600. The generated oscillating voltage is fed to the transmitter coil unit 800 of a rail contact via the capacitor 600.

Figure 1B:
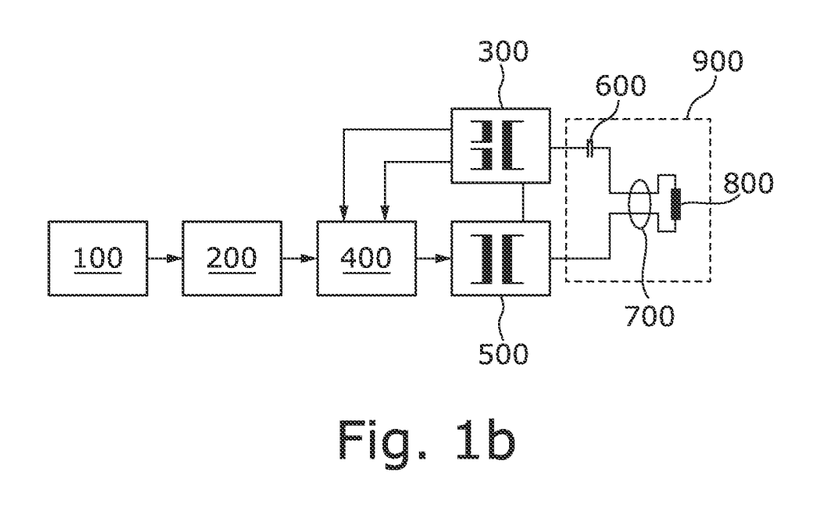
FIG. 1b shows a schematic layout of a preferred embodiment of the frequency generator according to the invention.

In a preferred embodiment, the output of the inverter 400 is connected to the capacitor 6 via a current power transformer 500 as shown in FIG. 1b. The power transformer 500 electrically isolates the series resonant circuit 900 from the other electronic components.

According to the invention, the frequency generator forms a self-oscillating inverter by providing a current transformer 300, which synchronizes the output voltage of the inverter 400 to the current in the series resonant circuit 900. For this, the current in the resonant circuit 900 is fed back to the inverter 400 via the current transformer 300. Thus, the frequency of the voltage at the output of the inverter 400 is adapted to the frequency defined by the capacitor 600 and the transmitter coil unit 800 (resonant circuit 900).

Figure 3:
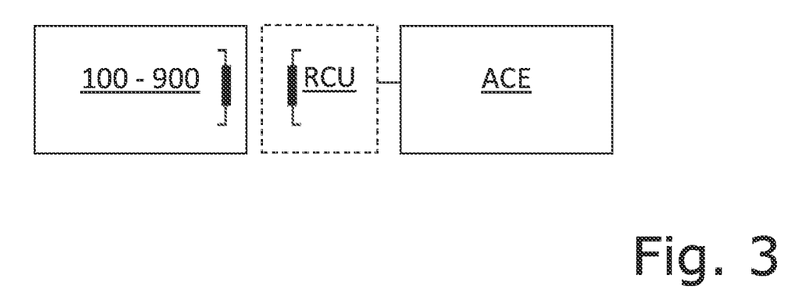
FIG. 3 shows an axle counter with the inventive frequency generator.

FIG. 3 shows a schematic illustration of the main components of an axle counter comprising the inventive frequency generator 100-900 (with indicated transmitting coil), a receiving coil unit RC (with indicated receiving coil) which is electrically connected to an axle counter evaluator ACE. The transmitting coil unit 800 and the receiving coil unit RCU are preferably positioned at opposite sides of a rail.

Figure 2:
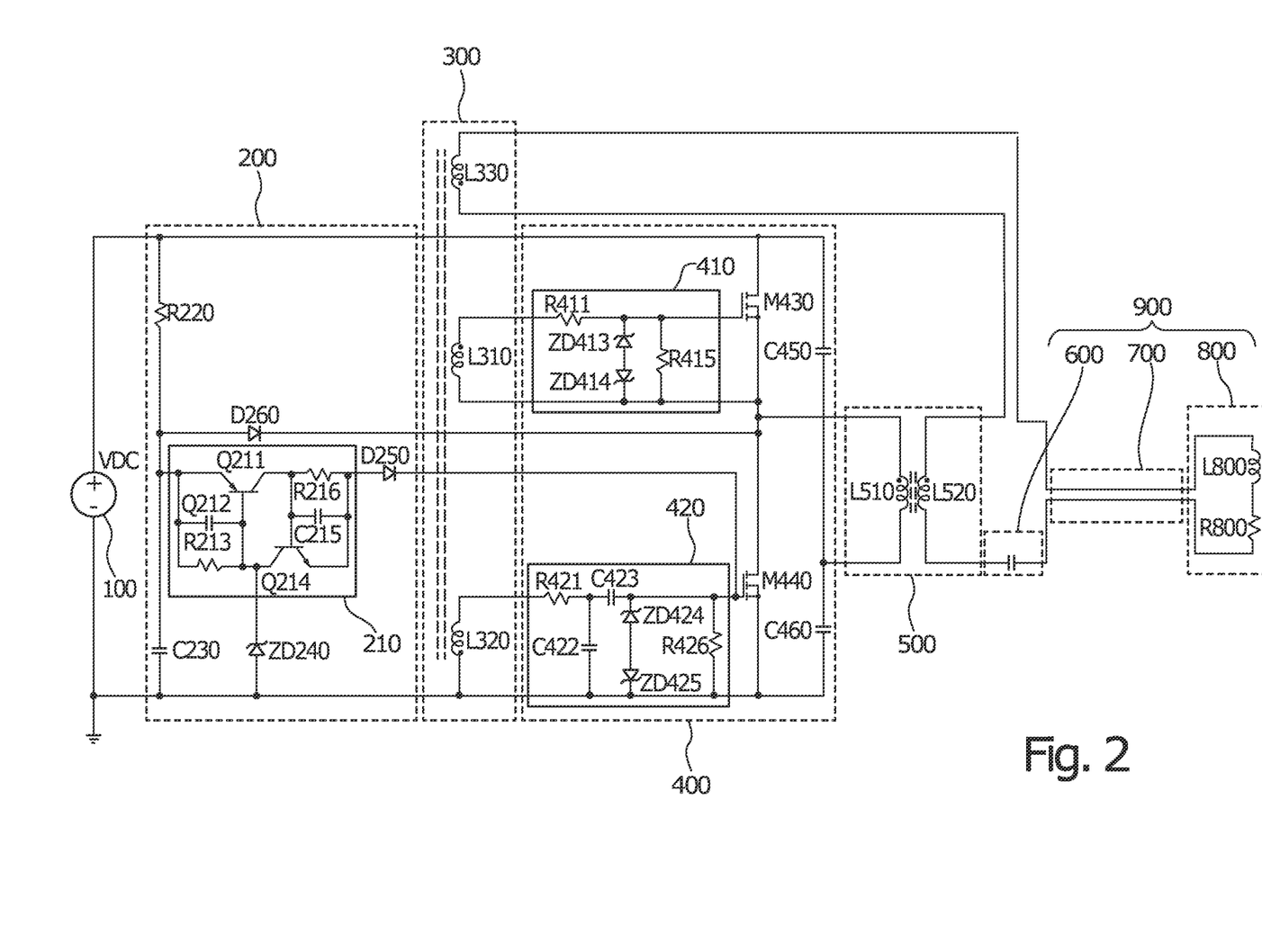
FIG. 2 shows a schematic layout of the frequency generator according to FIG. 1b with a preferred circuitry of the components of the frequency generator according to the invention.

FIG. 2 shows a preferred embodiment of the circuitry of the inventive frequency generator.

The inverter 400 is a half bridge inverter for generating an AC voltage. The inverter 400 comprises field effect transistors M430 and M440 (complementary inverter switches of the half bridge inverter 400) serially connected, wherein inverter switch M430 is controlled by a high-side gate driver 410 and inverter switch M440 is controlled by a low-side gate driver 420. Instead of field effect transistors other controlled switched can be used for switching the half bridge inverter 400).

The inverter 400 comprises a power input for feeding power form the input power supply, a control input (receiving signals from the output of the startup circuit 200 which is connected via Diode D250 to the input of field effect transistor M440) and a control input for feeding back current of the series resonant circuit (input coming from transformer 300 represented by primary coils L310, L320). The signal at the control input switches field effect transistor M440 the first time because there is not yet an appropriate signal from the low-side gate driver 420.

Figure 4:
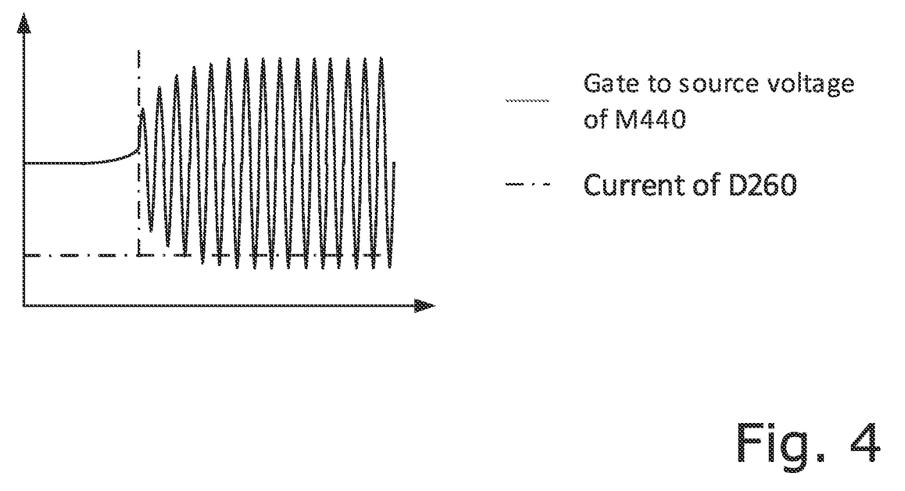
FIG. 4 shows the triggering current at startup and the resulting gate to source voltage at an inverter switch.

Initially the start-up circuit 200 starts the inverter. The start-up circuit 200 comprises a capacitor C230 connected in parallel to a series connection of a latch 210 and a zener diode ZD240. The latch 210 triggers the gate of inverter switch M440 of the inverter 400 when the voltage across the capacitor C230 exceeds a threshold voltage, $V_{TH}=V_{EB\_Q211}+V_{ZD240}$ where $V_{EB\_Q211}$ and $V_{ZD240}$ stand for emitter-base turn-on voltage drop of transistor Q211 of the latch 210 and the breakdown voltage of zener diode ZD240. When the start-up circuit 200 triggers inverter switch M440 to conduct, the inverter 400 starts to oscillate. Typical triggering current at startup and the resulting gate to source voltage at an inverter switch is shown in FIG. 4. Switching through inverter switch M440 in turn disables, i.e., deactivates the start-up circuit 200 by discharging capacitor C230 through a diode D260, which connects the capacitor C230 with the inverter switches M430, M440.

The input voltage VDC of the DC power supply 100 is input to the inverter 400 via the power input. The inverter 400 outputs an output voltage across power source 100 and center tap (between field effect transistors M430 and M440) of half bridge inverter 400.

The series resonant circuit 900 comprises the resonant capacitor 600, a field cable 700 and the transmitter coil unit 800 with inductance L800 and internal series resistance R800, the inductance L800 and internal series resistance R800 representing the total complex impedance of the solenoid including the field cable 700. The series resonant circuit 900 is characterized by three parameters; the resonant frequency $f_0$, the characteristic impedance $R_0$ and the quality factor Q.

$$f_0 = \frac{1}{2\pi\sqrt{L800 * C600}} \qquad \text{a.}$$

$$R_0 = \sqrt{\frac{L800}{C600}} \qquad \text{b.}$$

$$Q = \frac{R_0}{R800} \qquad \text{c.}$$

With $j=\sqrt{-1}$ and normalized frequency $$f_n = \frac{f}{f_0},$$

the complex impedance of the series resonant circuit is $$Z(f_n) = R_0 * \left(j * \left(f_n - \frac{1}{f_n}\right) + \frac{1}{Q}\right)$$

and the bandwidth of the series resonant circuit is $$BW = \frac{f_0}{Q}.$$

Figure 5:
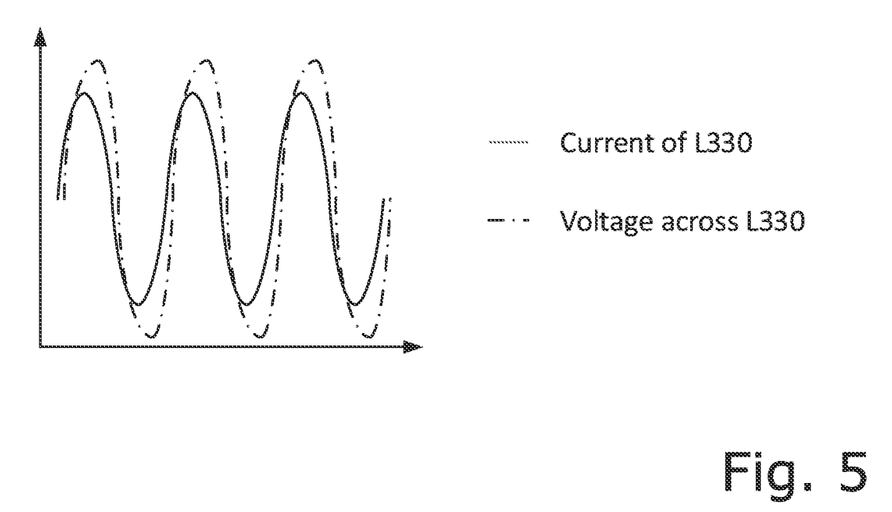
FIG. 5 shows typical waveforms of voltage at and current through secondary coil of current transformer.

The inventive frequency generator is self-oscillating enabling a feedback of the current in the series resonant circuit, which results from the output voltage of the inverter to the inverter. This realized by providing a current transformer with two identical primary coils L310, L320 and a secondary coil L330. The current in the series resonant circuit 900 flows through the secondary coil L330 of the current transformer 300 and is fed back to inverter 400 via the primary coils L310, L320 of the current transformer 300. Typical waveforms of voltage and current of secondary coil 330 are shown in FIG. 5.

Figure 6:
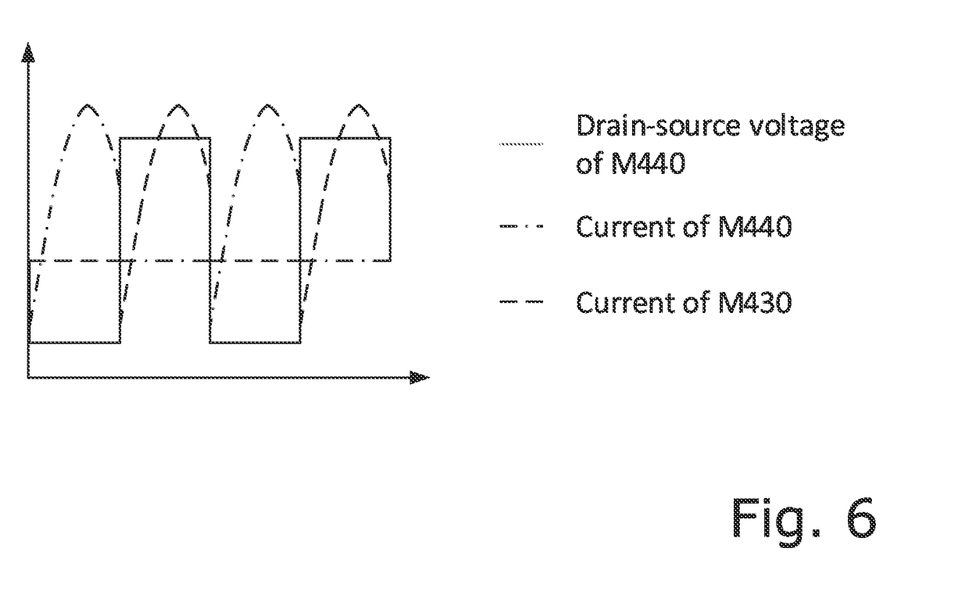
FIG. 6 shows typical waveforms of voltage at and current through inverter switches.

One primary coil L310 is electrically connected to the high-side gate driver 410 and the other primary coil L320 is electrically connected to the low-side gate driver 420 at their respective control inputs of the inverter 400. The current induced in the primary coils L320, L330 switches the field effect transistors M430, M440. The primary coils L310, L320 have opposite winding directions, which results in only one of the inverter switches M430, M440 being conductive at a time. Typical waveforms of voltage and current through inverter switches M430, M440 are shown in FIG. 6.

The feedback of the current of the series resonant circuit via the current transformer 300 effects that the output voltage of the inverter is synchronized with the current in the resonance circuit. In consequence, the frequency of the output voltage of the inverter is identical to the working frequency (resonant frequency $f_0$) of the series resonant circuit. The inventive frequency generator ensures that the output voltage of inverter is in phase with current of the series resonant circuit.

Figure 7:
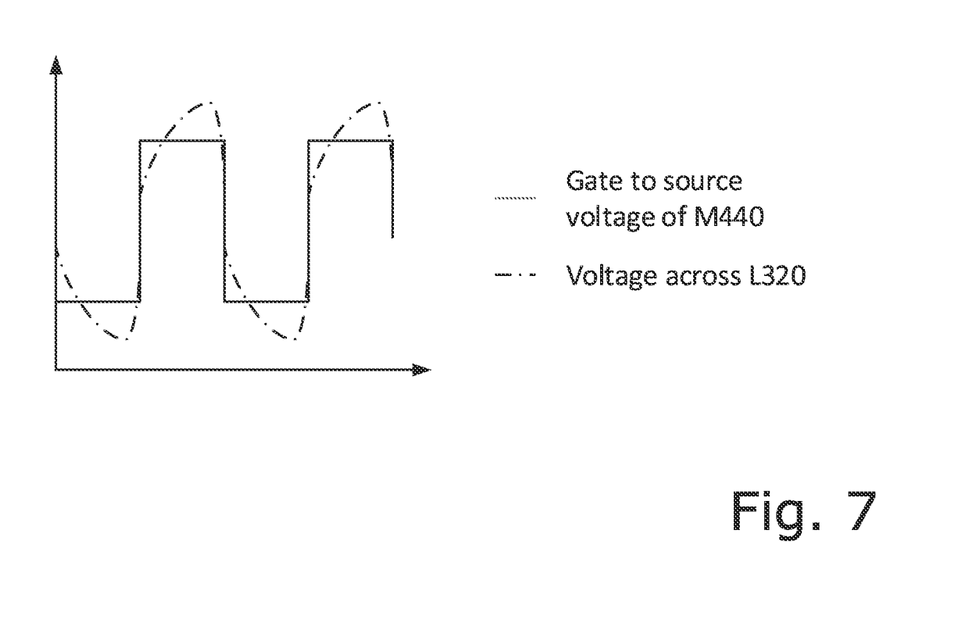
FIG. 7 shows typical waveforms of voltage at and current through low-side gate driver.

The high-side gate driver 420 and the low-side gate driver 420 are largely complimentary. The low gate driver comprises zener diodes D424 and ZD425 which clamp the gate voltage of field effect transistor M440 to $\pm(V_{ZD}+V_F)$ where $V_{ZD}$ and $V_F$ represent the breakdown voltage and the forward voltage drop of zener diodes ZD424 and ZD425. The same applies for zener diodes D413 and ZD414 of high-side gate driver 410. Typical waveforms of voltage and current through low-side gate driver 420 are shown in FIG. 7.

Figure 8:
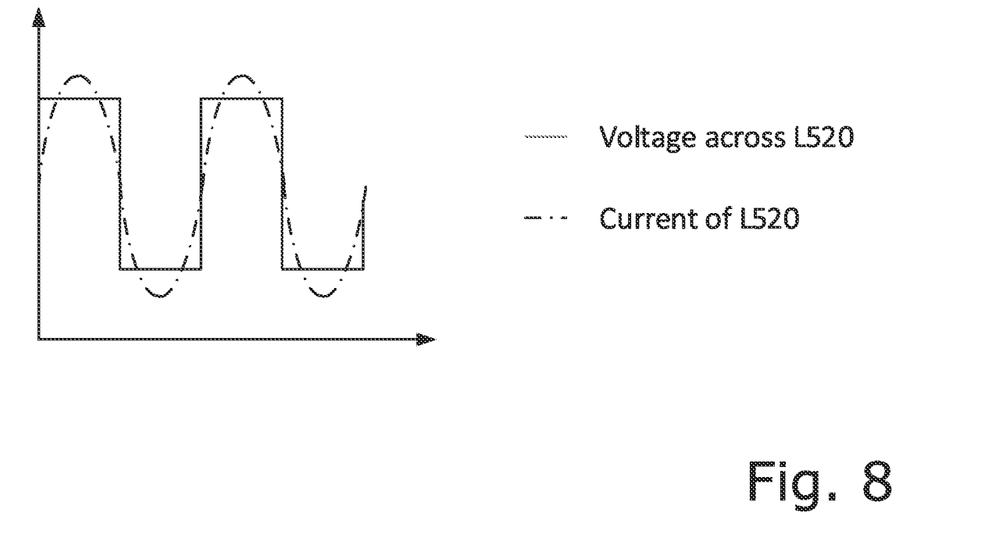
FIG. 8 shows typical waveforms of voltage at and current through power transformer.

In the embodiment shown in FIG. 2, the output voltage of inverter 400, which is a square wave of amplitude ±VDC/2(V) with frequency f, is applied to the series resonant circuit 900 via the power transformer 500. The power transformer 500 comprises a primary coil L510 and a secondary coil L520, wherein the inverter 400 is at the primary side and the series resonant circuit 900 is at the secondary side of the power transformer 500. The power transformer 500 is used primarily for electrical insulation between inverter 400 and series resonant circuit 900. The turn ratio $$n = \frac{Ns}{Np} = \sqrt{\frac{L520}{L510}}$$

can therefore be about 1. Typical waveforms of voltage and current through power transformer 500 are shown in FIG. 8.

Finally, the inventive frequency generator results in an optimized working frequency in the transmitter coil unit of 800 the series resonant circuit 900.

Figure 9:
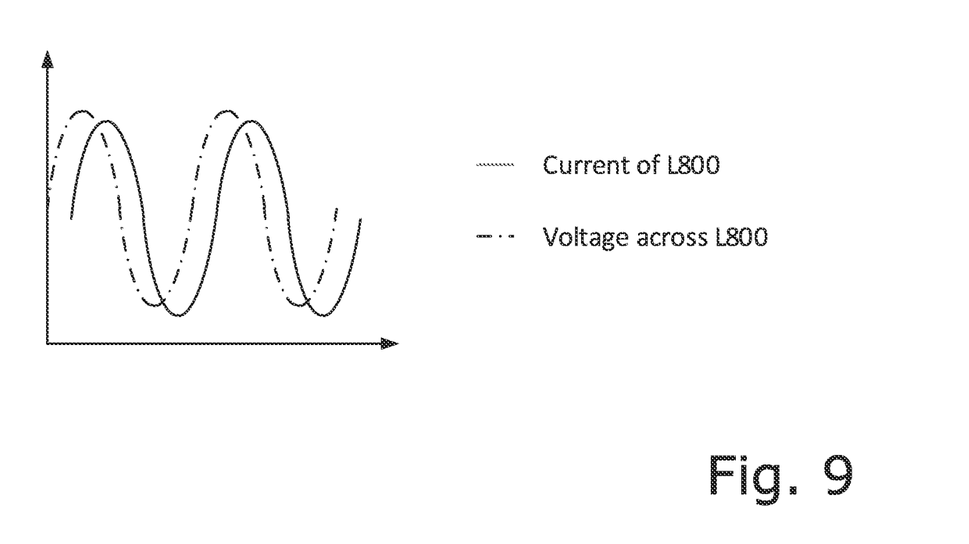
FIG. 9 shows typical waveforms of voltage at and current through transmitter coil unit of series resonant circuit.

Typical waveforms of voltage and current transmitter coil unit of 800 are shown in FIG. 9.

The inventive frequency generator also comprises a short circuit protection in order to protect the frequency generator in case of a fault of the field cable 700. A fault of the field cable 700 would open/short-circuit the output of the inverter 400. When the field cable 700 is open-circuited, the inverter 400 stops oscillating because the feedback is missing. However, if the field cable 700 is short-circuited, a high-frequency oscillation occurs. The short circuit current would permanently damage the inverter 400 if the inverter was not protected. Therefore, the low-side gate driver 420 comprises a low pass filter, which comprises resistor R421 and short-circuit protection capacitor C422 to remove unwanted high-frequency oscillations. Thus, together with resistor R421 the short-circuit protection capacitor C422 acts as a low pass filter at the input of the low-side gate driver. Since a short circuit at the output would cause a high-frequency oscillation, the low pass filter has a protective effect.

The inverter 400 further comprises DC blocking capacitors C460 and C450, which also work as input voltage divider. The DC blocking capacitors C460 and C450 are connected in series, wherein the input voltage VDC is applied to the series connection of the DC blocking capacitors C460 and C470. A further DC blocking capacitor C423 is provided in the low-side gate driver 420.

LIST OF REFERENCE SIGNS

100 DC power supply
200 start-up circuit
210 latch of start-up circuit
C230 capacitor
D260 diode
Q211 transistor
ZD240 zener diode
300 current transformer
L310 primary windings of current transformer connected to high-side gate driver
L320 primary windings current transformer connected to low-side gate driver
L330 secondary winding connected to series resonant circuit
400 inverter
410 high-side gate driver
420 low-side gate driver
C423 DC blocking capacitor
C460, C470 DC blocking capacitors
M430 FET at output of high-side gate driver
M440 FET at output of low-side gate driver
R421 resistor, together with capacitor 422, forming a high path filter
C422 short-circuit protection capacitor
ZD424, ZD425 oppositely switched zener diodes filter of low-side gate driver
ZD413, ZD414 oppositely switched zener diodes filter of high-side gate driver
500 power transformer
L510 primary windings of power transformer
L520 secondary windings of power transformer
600 resonant capacitor
700 field cable
800 transmitter coil unit
900 series resonant circuit
RCU receiving coil unit
ACE axle counter evaluator

LIST OF CITED DOCUMENTS

[Thales] Thales Transportation Systems GmbH
Axle Counter Az LM—Thales' flagship system for train detection in any application 2016
[Siemens] Siemens Semiconductor Group
BSM 50 GB 170 DN2-IGBT Power Module
31.07.1996
[Wang] Wang et al.
2.65-MHz Self-Oscillating Complementary Electronic Ballast With Constant-Lamp-Current Control for a Metal Halide Lamp. Power Electronics,
IEEE Transactions on. 22. 2097-2105
2007

What is claimed is:
1. A frequency generator configured for generating a working frequency for a transmission signal of a rail contact of an axle counter, the frequency generator comprising:

a series resonant circuit comprising a transmitter coil unit of the rail contact and a capacitor;

an inverter, the output of which is connected to the capacitor;

wherein the inverter is configured to generate an oscillating voltage and to feed the generated oscillating voltage to the transmitter coil unit of the rail contact via the capacitor;

a current transformer configured for synchronizing the output voltage of the inverter to the current in the series resonant circuit; and a start-up circuit electrically connected to the inverter and configured to trigger the inverter and configured to be electrically connected to an input power supply.

2. The frequency generator according to claim 1, wherein the current transformer feeds the current of the series resonant circuit to a control input of the inverter.

3. The frequency generator according to claim 1, wherein the current transformer comprises two identical primary coils and a secondary coil.

4. The frequency generator according to claim 3, wherein the secondary coil of current transformer is series-connected to the transmitter coil unit.

5. The frequency generator according to claim 1, wherein the inverter is configured to disable the startup circuit.

6. The frequency generator according to claim 1, wherein the inverter is a half bridge inverter.

7. The frequency generator according to claim 1, wherein the low gate drivers comprise a short-circuit protection capacitor.

8. The frequency generator according to claim 1, wherein a power transformer is electrically connected between the inverter and the capacitor.

9. The frequency generator according to claim 1, wherein the transmitter coil unit and the capacitor of the series resonant circuit is connected via a field cable.

10. The axle counter comprising the frequency generator according to claim 1.

11. A method for generating a working frequency for the rail contact of the axle counter using the frequency generator according to claim 1, wherein the output voltage of the inverter is synchronized to the current in the series resonant circuit by feeding back the current in the series resonant circuit to a control input of the inverter using a current transformer.

12. The method according to claim 11, wherein a DC voltage is applied to a start-up circuit, and that the start-up circuit triggers the inverter.

13. The method according to claim 12, wherein a power transformer is used for galvanic isolation of the series resonant circuit from other electronic components of the frequency generator.

* * * * *